United States Patent [19]
Onodera

[11] Patent Number: 4,903,830
[45] Date of Patent: Feb. 27, 1990

[54] AUTOMATIC MOUNTING CHIP COMPONENT

[75] Inventor: Toshiya Onodera, Furukawa, Japan

[73] Assignee: Alps Electric Co., Ltd., Tokyo, Japan

[21] Appl. No.: 301,782

[22] Filed: Jan. 25, 1989

[30] Foreign Application Priority Data

Feb. 12, 1988 [JP] Japan .............................. 63-17653[U]

[51] Int. Cl.$^4$ ............................................... H02H 1/00
[52] U.S. Cl. ..................................... 206/328; 206/332; 174/52.4; 174/263
[58] Field of Search ..................... 174/52.4, 52.2, 52.3, 174/68.5; 206/328, 332, 334; 361/212, 400, 403

[56] References Cited

U.S. PATENT DOCUMENTS

| 4,118,595 | 10/1978 | Pfahnl et al. | 174/68.5 |
| 4,130,772 | 12/1978 | Levijoki. | |
| 4,164,778 | 8/1979 | Sawairi et al. | 361/409 |
| 4,709,297 | 11/1987 | Walther | 206/328 |
| 4,762,606 | 8/1988 | Root | 206/328 |
| 4,814,943 | 3/1989 | Okuaki | 206/328 |
| 4,837,184 | 6/1989 | Lin et al. | 206/328 |

Primary Examiner—Joseph Man-Fu Moy
Attorney, Agent, or Firm—Guy W. Shoup; Stephen L. Malaska

[57] ABSTRACT

A novel tubular chip component for holding a probe for examination having a rectangularly parallelepipedic cross section and made of a metal having a solderable outer surface and a not solderable inner surface is disclosed. At least one side of said outer surface of the metal plate is used for anchoring the chip component and the anchoring side is formed by layering a metal plate thereon. A chip component of the present utility design is advantageous in that it can be detected by means of a light sensing element regardless of the direction of the light shed from a light source, that it can be produced with an enhanced workability, a low profile and a low cost and that the terminal of a probe can be securely held without being affected by the soldering operations that may take place during manufacturing the chip.

8 Claims, 4 Drawing Sheets

AUTOMATIC MOUNTING CHIP COMPONENT

BACKGROUND OF THE DISCLOSURE

1. Field of the Invention

This invention relates to a chip component to be mounted vis-a-vis on a print substrate by means of a mounter, said chip component being capable of holding a probe for examination.

2. Prior Art

A chip component having a configuration as illustrated either in FIG. 4(A), 4(B) or 4(C) and comprising a solderable metal plate 42 and a not solderable metal plate 41 is disclosed in Japanese Utility Design Application No. 62-186544.

A chip component as described above is mounted and soldered on a print substrate 61 as shown in FIG. 6 for holding a terminal 62 of a probe for examination of the voltage and the electric current applied to the printed substrate. For mounting a chip component of this prior art on a substrate for probing printed circuits, chip component 50 is taken up by a nozzle 51 for positioning and then placed on the right position, Once chip component 50 is mounted, light is shed on it from a light emitting member 52 to form its shadow, which is detected by a light sensing element 53 to determine if the chip is correctly mounted. In this prior art, the rays from the light emitting member perpendicularly strike the anchoring surface of the chip component. (See FIG. 5(A) A.) It should be noted, however, that the light connecting the light emitting member and the light sensing element can be either parallel to the longer edges of anchoring surface 54 of chip component 50 for circuit probe (FIG. 5(B) B) or parallel to the shorter edges of anchoring surface 54 of chip component 50 (FIG. 5 (B) C). With chip component 50 for circuit probe of this type, when the line connecting the light emitting member and the light sensing element is perpendicular to anchoring surface 54 of chip component 50 (FIG. 5(B) A) and when the line is parallel to the longer edges of the anchoring surface (FIG. 5(B) B), the light emitting member forms a shadow of chip component 50 which is large enough to be detected by the light sensing element. However, when the line between the light emitting member and the light sensing element is parallel to the shorter edges of anchoring surface 54 of chip component 50, the light coming out from the light emitting member strikes only the area of chip component 50 immediately under the nozzle and forms a shadow of the component only for its thickness (preferably approximately 0.3 mm), which is by no means large enough to be detected by the light sensing element. In order to avoid this problem and make it compatible with a mounter of any type, a chip component of this prior art, which is used for circuit examination, has to be formed from a metal plate having a considerable thickness (0.4 mm or more). Now referring to FIG. 3(A), chip component 31 having a thickness as described above is taken up by nozzle 51 by anchoring surface 32 for positioning and then placed on its correct position. Once it is placed, light is shed on lateral side 33 of the metal plate of chip component 31 next to anchoring surface 32 to form its shadow, which is detected by light sensing element 53. Since lateral side 33 has a relative large width, the shadow thus formed is large enough to be detected by the light sensing element to ensure that chip component 31 is correctly mounted. FIG. 3(B) shows a sectional view of chip component 31 for circuit examination, in which as in the case of the chip component shown in FIG. 4 outer surface 35 is made of a solderable metal while inner surface 34 is made of a not solderable metal.

Chip component 31 for circuit examination which is made of a relatively thick metal plate (0.4 mm or more) has certain drawbacks. Firstly, a thick metal plate to be used as a material for producing such components is poorly workable in a press machine as compared with a relatively thin metal plate. Secondly, a chip component made from such a thick metal plate inevitably has an increased height, which makes the component less stable in its mounted position. Thirdly, such a component needs more material and accordingly cost more than a component made of a thin metal plate.

SUMMARY OF THE INVENTION

The present Invention is devised to overcome these and other drawbacks of the prior art. Therefore, an object of the present Invention is to proved a highly workable, low profile and low cost chip component for circuit examination which is compatible with a mounter of any type.

In order to achieve the above object and other objects, according to the Invention, it is provided a tubular chip component having a rectangularly parallelepipedic cross section and made of a metal having a solderable outer surface and a not solderable inner surface, at least one side of said outer surface being used as an anchoring surface and said anchoring surface being formed by layering a metal plate thereon.

It is apparent that a chip component for circuit examination as described above is advantageous in that it can be detected by means of a light sensing element regardless of the direction of the light shed from a light source and that it can be produced with an enhanced workability, a low profile and a low cost.

Now the present Invention will be described in greater detail by referring to the accompanying drawings which illustrate examples of the present Invention.

DETAILED DESCRIPTION OF THE INVENTION

Figure 1A:
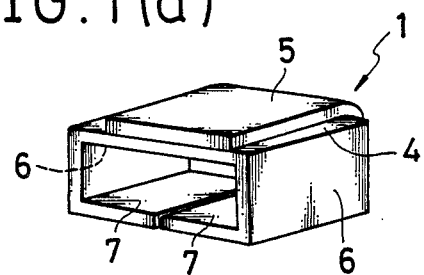
FIGS. 1(A) through 1(C) are perspective views illustrating three different examples of the chip component of the present Invention.
Figure 1B:
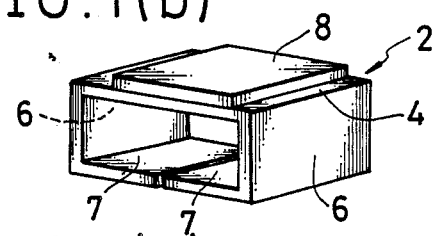
Figure 1C:
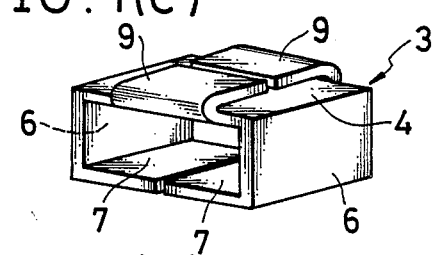
Figure 1D:
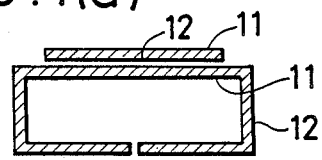
FIG. 1(D) is a sectional view of the example shown in FIG. 1(A).

Now the present Invention will be described by referring to FIGS. 1(A) through 1(D) and FIGS. 2(A) through 1(C). In FIG. 1(A), chip component 1 is made of a metal plate having a solderable surface and a not solderable surface and comprises base section 7, soldering section 6, upper plate section 4 and anchoring section 5 formed by folding an extension of upper plate section 4 and layed directly on the upper surface of said upper plate section 4. FIG. 1(D) is a sectional view of the chip component of FIG. 1(A), showing not solderable area 11 and solderable area 12. FIG. 1(B) shows another example of the chip component, in which anchoring section 8 is formed separately from upper plate section 4. In this example, anchoring section 8 is bonded to the upper plate section by welding or by some other means. FIG. 1(C) shows another example of chip component 1, in which two extensions on the opposite sides of upper plate section 4 are folded to form anchoring section 9. As in FIG. 1(A), reference numerals 6 and 7 respectively denote a soldering section and a base section of the chip components of FIG. 1(B) and 1(C). Likewise, in the chip components of FIGS. 1(B) and 1(C), upper plate section 4 and soldering section 6 represent solderable areas whereas all the inner surface of the tubular body forming the chip component is not solderable.

Figure 2A:
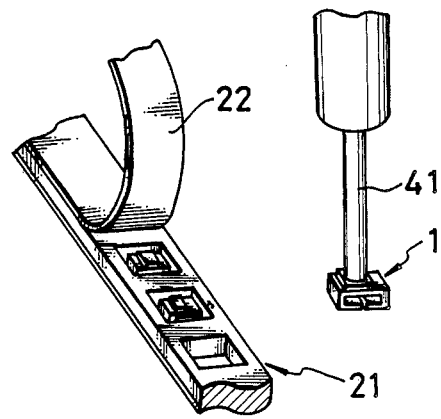
FIGS. 2(A) through 2(C) show three different mounting processes using a mounter provided by the present Invention.
Figure 2B:
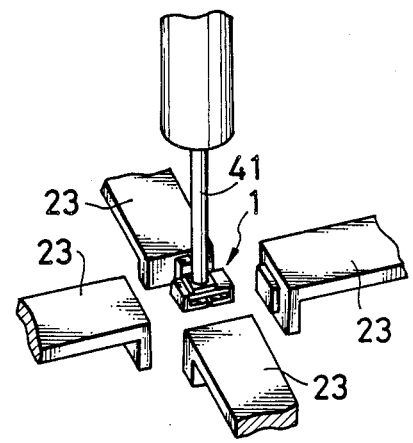
Figure 2C:
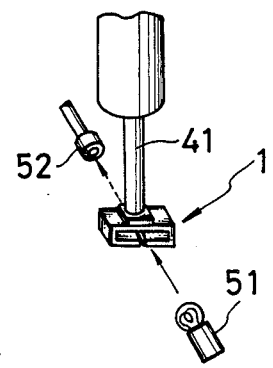
Figure 3A:
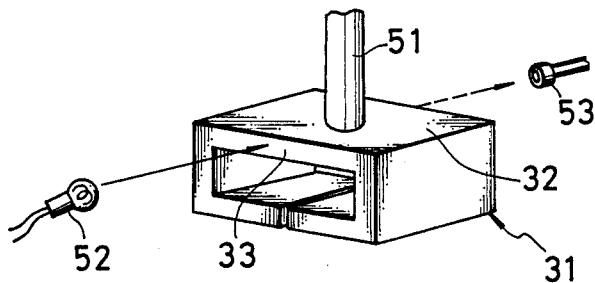
FIG. 3(A) is a perspective view of a conventional mounter assembly illustrating how the chip component is detected.
Figure 3B:
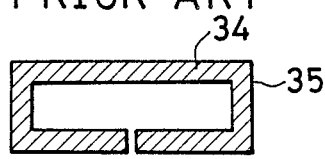
FIG. 3(B) is a sectional view of a conventional chip component.
Figure 4A:
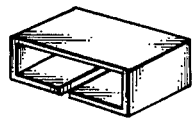
FIGS. 4(A) through 4(C) are perspective views of three conventional chip component having different configurations.
Figure 4B:
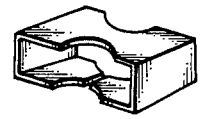
Figure 4C:
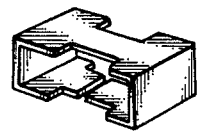
Figure 4D:
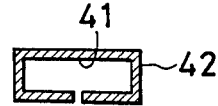
FIG. 4(D) is a sectional view of a conventional chip component.
Figure 5A:
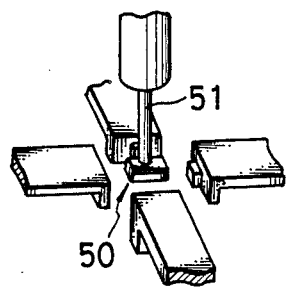
FIGS. 5(A) and 5(B) are perspective views illustrating how a conventional chip component is mounted by means of a conventional mounter.
Figure 5B:
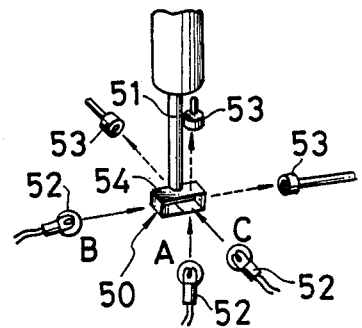
Figure 6:
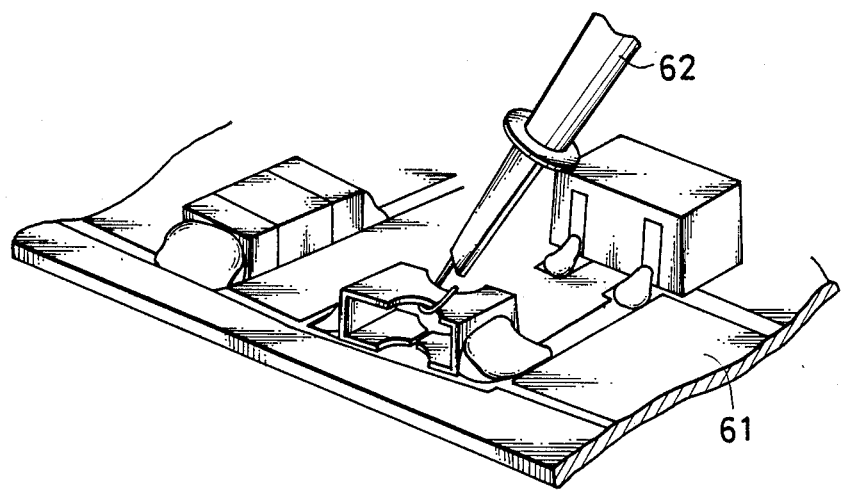
FIG. 6 is a perspective view illustrating how a conventional chip component is used.

FIGS. 2(A) through 2(C) illustrate how a chip component for circuit examination of the present Invention is mounted. In FIG. 2(A), chip component 1 packed in tape 21 is taken out by peeling off top tape 22 and by attracting onto nozzle 41. As illustrated in FIG. 2(B), chip component 1 is placed on its right position by means of positioning guide 22. As illustrated in FIG. 2(C), a shadow of chip component 1 is formed by light emitted from light emitting member 51 and the shadow is detected by a light sensing element 52 determine if chip component 1 is correctly placed. Once correct positioning of chip component 1 is ensured, it is soldered to the print substrate as in the prior art and the terminal of a probe is held thereto for measurement of the voltage and the electric current found the circuit of the print substrate.

While only one anchoring surface is provided in each of the above examples of the chip component of the present Invention, it may be apparent that a pair of anchoring surfaces may be provided on the opposite sides of a chip component if such an arrangement is required due to the construction of a chip.

A chip component of the present invention as described above is a highly workable, low profile and low cost chip component that can be compatible with a mounter of any type.

It should be noted that, since the anchoring section is formed by folding an extension of the upper plate of a chip component upside down on the upper plate, both the top and bottom sides of the anchoring section become not solderable, providing a significant advantage that the terminal of a probe can be securely held without being affected by the soldering operations that may take place during manufacturing the chip.

What is claimed is:

1. An automatic mounting chip component comprising at least one metal sheet each having one surface which is solderable and other surface which is not solderable, said metal sheet being arranged to form a cylindrical body of a rectangular cross section in such a manner that said one solderable surface lies inside thereof, at least one of the outer surface portions of said cylindrical body being formed as an anchoring surface which is formed of the superimposed metal sheet portions.

2. An automatic mounting chip component as claimed in claim 1, wherein said metal sheet for forming the chip component is formed in a cylindrical shape by continuously pressing one metal sheet, and said anchoring surface is formed by folding inwards an extension provided protuberantly on the upper surface sheet portion.

3. An automatic mounting chip component as claimed in claim 1, wherein said anchoring surface provided on the upper surface sheet portion is formed of another metal sheet secured on the upper surface sheet portion.

4. An automatic mounting chip component as claimed in claim 1, wherein said extension provided protuberantly on the upper surface sheet portion comprises a pair of protrusion strips which are inwards bended to form said anchoring surface.

5. An automatic mounting chip component comprising at least one metal sheet each having one surface which is solderable and other surface which is not solderable, said metal sheet being arranged to form a cylindrical body of a rectangular cross section in such a manner that said other non-solderable surface lies inside thereof, the upper surface of the outer surface portions of said cylindrical body being formed as an anchoring surface which is formed of the flat portion of two superimposed metal sheet portions.

6. An automatic mounting chip component as claimed in claims 1 and 5, wherein said anchoring surface comprises said non-solderable surface.

7. An automatic mounting chip component as claimed in claims 1 and 5, wherein a printed circuit board is secured on the side and bottom portions of the chip component by means of soldering, and probe terminals for measuring a current and voltage are mounted within the space of said cylindrical body.

8. An automatic mounting chip component as claimed in any one of claims 1 to 7, wherein said chip component is inserted into the hole provided on a tape strip in such a manner that said anchoring surface is positioned upwards, and is abutted on an automatic mounting nozzle for mounting the chip component on the printed circuit board.

* * * * *